United States Patent [19]

Cain et al.

[11] Patent Number: 5,503,881
[45] Date of Patent: Apr. 2, 1996

[54] METHOD OF PROCESSING A SEMICONDUCTOR WAFER

[75] Inventors: John L. Cain, Schertz; Michael P. Relue, San Antonio; Michael E. Costabile, San Antonio; William P. Marsh, San Antonio, all of Tex.

[73] Assignee: VLSI Technology, Inc., San Jose, Calif.

[21] Appl. No.: 440,102

[22] Filed: May 12, 1995

Related U.S. Application Data

[62] Division of Ser. No. 42,921, Apr. 5, 1993, Pat. No. 5,439,524.

[51] Int. Cl.$^6$ ....................................... H05H 1/24
[52] U.S. Cl. .................. 427/569; 427/58; 427/171; 427/248.1; 427/299; 437/173; 437/225; 437/925
[58] Field of Search .............................. 427/569, 58, 171, 427/248.1, 299; 437/173, 225, 925

[56] References Cited

U.S. PATENT DOCUMENTS

| | | | |
|---|---|---|---|
| 4,297,162 | 10/1981 | Mundt et al. | 156/643 |
| 4,342,901 | 8/1982 | Zajac | 219/121 |
| 4,624,767 | 11/1986 | Obinata | 204/298 |
| 4,758,559 | 3/1986 | Hijikata et al. | 219/121 |
| 5,203,958 | 4/1993 | Arai et al. | 156/643 |
| 5,248,371 | 9/1993 | Maher et al. | 156/345 |
| 5,266,153 | 11/1993 | Thomas | 156/643 |

FOREIGN PATENT DOCUMENTS

| | | | |
|---|---|---|---|
| 5846638 | 3/1983 | Japan | 118/723 E |
| 6293373 | 4/1987 | Japan | 118/723 E |
| 62219912 | 9/1987 | Japan | 118/723 E |
| 1205078 | 8/1989 | Japan | 118/723 E |

OTHER PUBLICATIONS

*Webster's Third New International Dictionary*, Merriam Webster, Inc., 1987, p. 469.

*Primary Examiner*—Bernard Pianalto
*Attorney, Agent, or Firm*—Hickman & Beyer

[57] ABSTRACT

An improved fluid distribution head for a plasma processing system characterized by a non-planar dispersion plate provided with a plurality of apertures formed therethrough, and a mechanism for flowing a process gas through the apertures of the dispersion plate. The non-planar dispersion plate is preferably provided with a concave, spherical portion having a radius of curvature of at least four feet. The mechanism for flowing the process gas through the apertures includes an enclosure defining a chamber which communicates with the dispersion plate, a gas inlet communicating with the chamber, and a source of process gas coupled to the gas inlet. The fluid distribution head preferably forms a part of a complete plasma processing system including a wafer pedestal and an R.F. generator coupled to the pedestal to form a plasma between the dispersion plate and the wafer from the process gas flowing from the dispersion plate. A method for processing a semiconductor wafer includes the steps of clamping a wafer to a pedestal (thereby imposing a curvature on the wafer) and releasing a process fluid over the wafer through a plurality of apertures provided in a non-planar dispersion plate having a complementary curvature to the curvature of the wafer.

9 Claims, 4 Drawing Sheets

METHOD OF PROCESSING A SEMICONDUCTOR WAFER

This is a divisional of application Ser. No. 08/042,921 filed on Apr. 5, 1993, U.S. Pat. No. 5,439,524.

BACKGROUND OF THE INVENTION

This invention relates to the fabrication of integrated circuits and, more particularly, to plasma processing equipment for semiconductor wafers.

Integrated circuits are typically made using semiconductor wafers such as silicon wafers. Semiconductor wafers are processed into integrated circuits by forming transistors and other circuit elements on the wafer surface with a sequence of process steps.

A commonly used semiconductor manufacturing process is chemical vapor deposition (CVD) in which a film of a dielectric or conductive material is deposited upon the surface of a semiconductor wafer. Another commonly used process is a plasma or reactive ion etch, in which layers of material are etched away from exposed surface areas of the wafer. A common plasma etchant is formed from the mixture of $CF_4$ and $O_2$.

A prior art plasma processing system 10 is illustrated in FIG. 1. A process gas enters a fluid distribution head 12 (sometimes called a "showerhead") through a fluid inlet pipe 14. The process gas flows into a manifold or chamber 18 of the head 12 and exits through a number of apertures 20 in a planar dispersion plate 22. A semiconductor wafer 24 is typically held by a ring clamp 26 against a top surface 29 of a pedestal 28. The top surface 29 is often domed having a spherical radius Rp of about fifteen feet to maintain good physical contact with wafer 28, which tends to bend when it is clamped and heated by the plasma reaction. A radio frequency (RF) generator 32 is coupled between the plate 22 and the pedestal 28. The RF generator 32 forms a plasma 25 from the process gasses between the plate 22 (which serves as an anode) and the pedestal 28 (which serves as a cathode). Positive ions in the plasma 25 are accelerated towards the pedestal 28 to deposit upon or etch the surface of the wafer 24.

As mentioned previously, the semiconductor wafer 24 bends or deforms due to its clamping to the pedestal and due to the heat generated during plasma processing. Because non-uniform temperatures cause non-uniformities in processing, the pedestal 28 is preferably domed to maintain a uniform thermal contact with the semiconductor wafer 24. While this method helps the problem of maintaining uniform temperatures on all portions of the semiconductor wafer 24, it is found through experimentation that the different distances between portions of the curved semiconductor wafer 24 and the prior art planar dispersion plate 22 are responsible for other non-uniformities. These non-uniformities tend to be concentric in nature due to the geometries involved.

Because of the small feature sizes of modern integrated circuits, the uniform deposition or removal of materials over the surface of a wafer is crucial to the quality and yield of the finished product. Process parameters such as power, pressure, gas flow, or distance of the distribution head from the pedestal are often adjusted in an attempt to improved process uniformity. Such adjustments are typically made on an empirical basis when the process uniformity has been determined to be substandard, and are time consuming and uncertain. It is therefore desirable to make structural improvements to plasma processing systems which improve process uniformity without resorting to the adjustment of process parameters.

SUMMARY OF THE INVENTION

The present invention achieves superior process uniformity in plasma processing systems by providing a fluid distribution head having a non-planar dispersion plate. This non-planar dispersion plate compensates for concentric non-uniformities caused by prior art planar dispersion plates.

A fluid distribution head in accordance with the present invention includes a non-planar dispersion plate provided with a plurality of apertures, and a mechanism for providing a flow of process gas through the apertures of the dispersion plate. Preferably, the dispersion plate has a curved surface including a concave spherical section having a radius of curvature of at least four feet.

The fluid distribution head can form a part of a plasma processing system. In addition to the fluid distribution head, the plasma processing system includes a pedestal adapted to support a workpiece, and an R.F. generator coupled to the pedestal to develop a plasma between the dispersion plate and the workpiece from the process gas released through the dispersion plate. The pedestal therefore serves as a cathode of the plasma processing system, and the dispersion plate can serve as an anode by coupling it to the R.F. generator. Alternatively, the dispersion plate can be allowed to electrically float.

A method for processing a semiconductor wafer in accordance with the present invention includes the steps of clamping a semiconductor wafer to a pedestal, thereby imparting a curvature upon the wafer, and releasing a process fluid over the wafer through a plurality of apertures formed in a non-planar dispersion plate having a complementary curvature to the curvature of the semiconductor wafer. The complementary curvature can be greater than, equal to, or less than the curvature of the wafer.

Other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
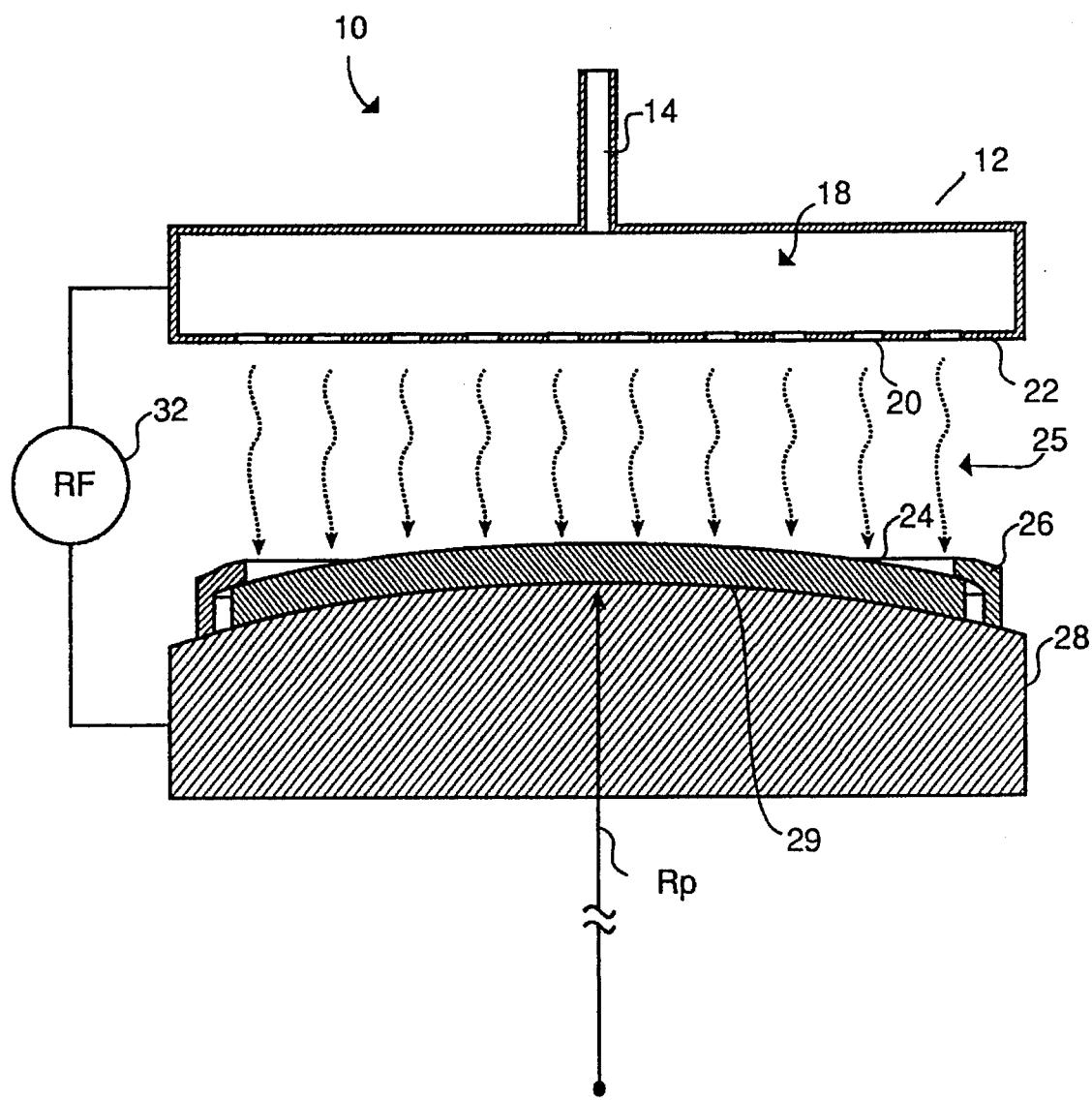
FIG. 1 is a sectional, front elevational view of a semiconductor wafer processing system of the prior art.
Figure 2:
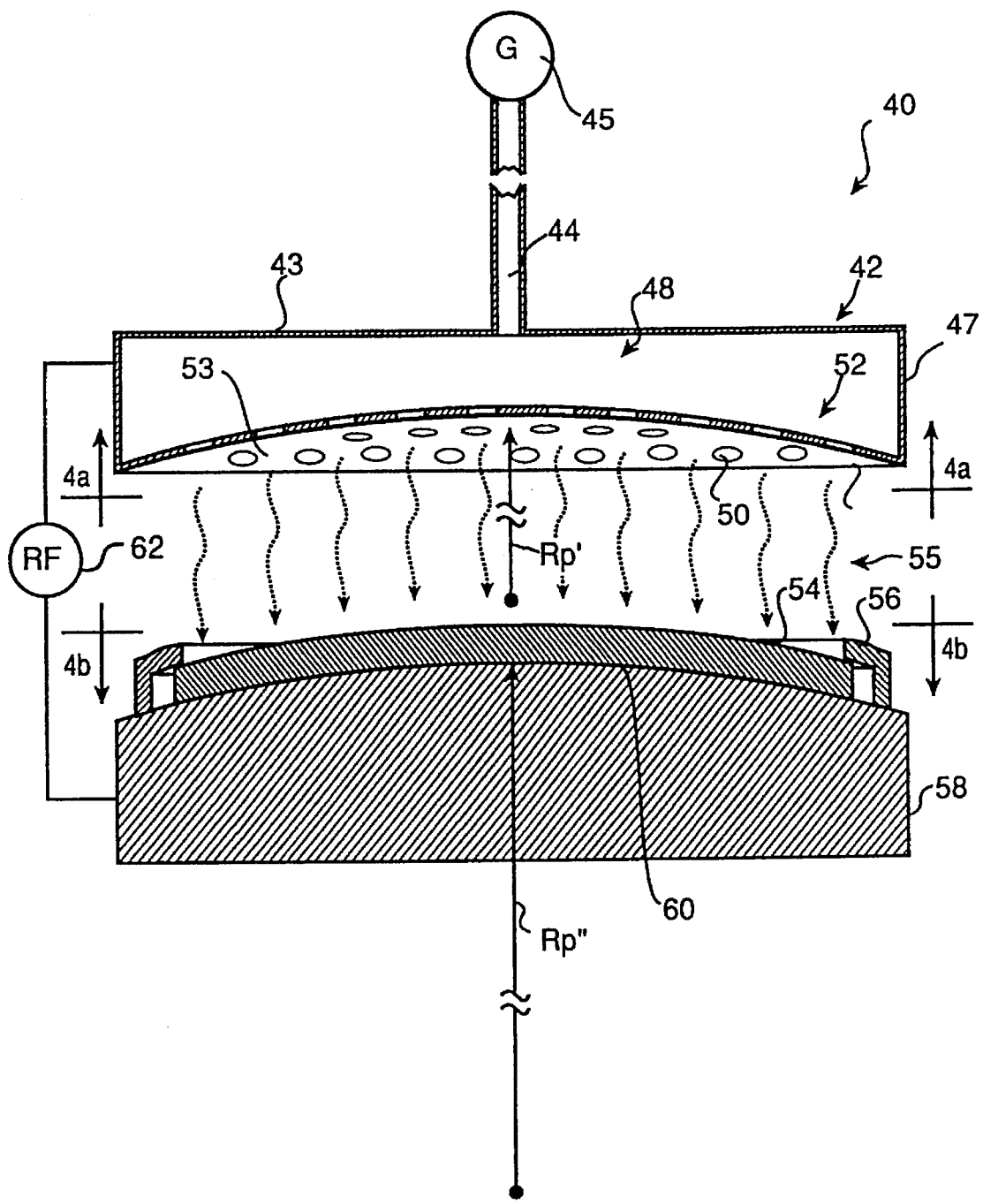
FIG. 2 is a sectional, front elevational view of a semiconductor wafer processing system of the present invention.

FIG. 1 illustrates a plasma processing system 10 of the prior art that was described previously. FIG. 2 illustrates a plasma processing system 40 of the present invention.

In FIG. 2, system 40 includes a fluid distribution head 42 coupled to a fluid inlet pipe 44. Preferably, the inlet pipe 44 is centered on a top wall 43 of the fluid distribution head 42. A process gas flows from a gas source 45 into a chamber 48 of the fluid distribution head 42 and then exits through a number of apertures 50 in a non-planar dispersion plate 52 of the fluid distribution head 42. The chamber 48 is defined by the top wall 43, cylindrical side walls 47, and the dispersion plate 52. The process gas flows toward a semiconductor wafer 54 as indicated by arrows 55.

In the embodiment of FIG. 2, the dispersion plate 52 has a concave outer surface 53 having a curvature radius Rp' of about fifteen feet. A semiconductor wafer 54 or other workpiece is preferably held by a clamp 56 to a top surface 60 of a pedestal 58. The pedestal 58 top surface 60 is preferably slightly domed as a convex spherical section having a radius Rp" of about 15 feet.

An RF generator 62 is coupled to the pedestal 58 to provide a plasma between the dispersion plate 52 and the wafer 54. When operating in a reactive ion etch (RIE) mode, the dispersion plate 52 is allowed to electrically float. When operating in a conventional plasma processing mode, the dispersion plate is also coupled to the R.F. generator, as shown in FIG. 2. As the process gas flows from the fluid distribution head 42 towards the semiconductor wafer 54, the RF generator 62 produces a plasma which accelerates positive ions formed from the process gas towards the wafer 54 due to a negative charge developed on the pedestal 58 by plasma or by a separate biasing generator (not shown). In the embodiment shown in FIG. 2, the pedestal 58 comprises an a cathode for the system, and the dispersion plate 52 comprises an anode for the system.

Because the curvature of the dispersion plate 52 is complementary to the curvature of the wafer 54, the distance between various sections of the dispersion plate 52 and the semiconductor wafer 54 are substantially the same. This allows the amount of process gas 55 reaching the wafer 54 to be about the same, and furthermore provides a more uniform plasma over the wafer surface. Both of these conditions promote uniformity in the processing of semiconductor wafer 54.

Figure 3A:
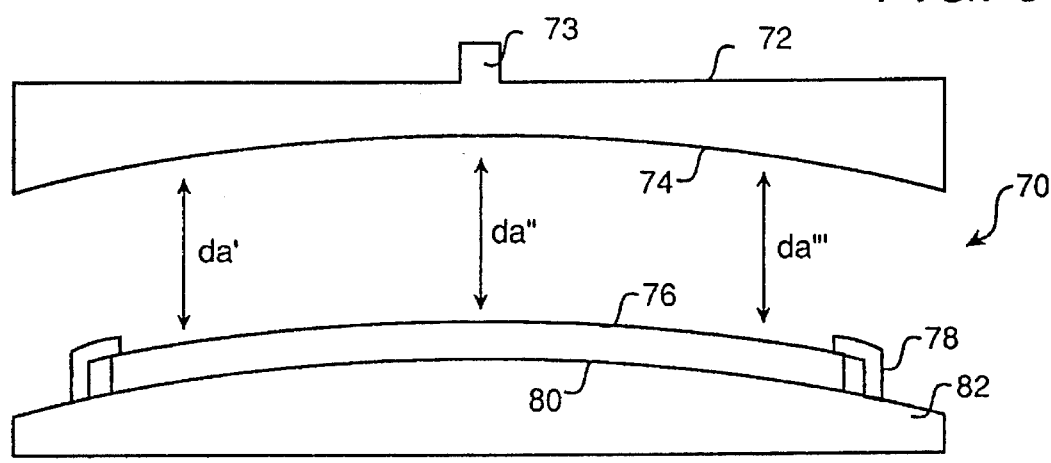
FIG. 3a is a pictorial view of a first embodiment of the present invention where the dispersion plate curvature is approximately equal to the curvature of the pedestal and wafer.

FIG. 3a is a pictorial view of a semiconductor wafer processing system 70 where a fluid dispersion head 72 has a fluid inlet 73 and a bottom surface 74 provided with a plurality of apertures, where the bottom surface 74 has a similar radius of curvature to the radius of curvature a semiconductor wafer 76 held by a clamp 78 to a top surface 80 of a pedestal 82. The distances da', da", and da''' between the semiconductor wafer 76 and the fluid dispersion head 72 are substantially equal at all locations, i.e. da'≈da"≈da'''. This is a preferred system for when the flow of fluid from the dispersion head 72 is substantially uniform across surface 74.

Figure 3B:
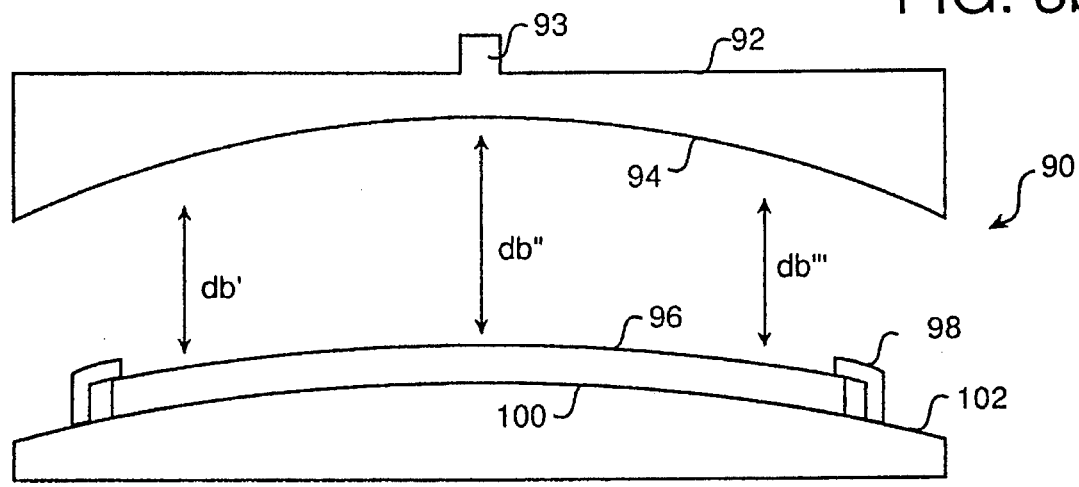
FIG. 3b is a pictorial view of a second embodiment of the present invention where the dispersion plate curvature is greater than the curvature of the pedestal and wafer.

FIG. 3b is a pictorial view of a semiconductor wafer processing system 90 where a fluid dispersion head 92 has a fluid inlet 93 and a bottom surface 94 provided with a plurality of apertures, where the bottom surface 94 has a radius of curvature less than the radius of curvature of a semiconductor wafer 96 held by a clamp 98 to a top surface 100 of a pedestal 102. The distances db', db", and db''' between the semiconductor wafer 96 and the fluid dispersion head 92 are therefore not equal. That is db'<db">db'''. This is a preferred system for when the flow of fluid from the dispersion head 92 is greater at db", which is located directly below fluid inlet 93.

Figure 3C:
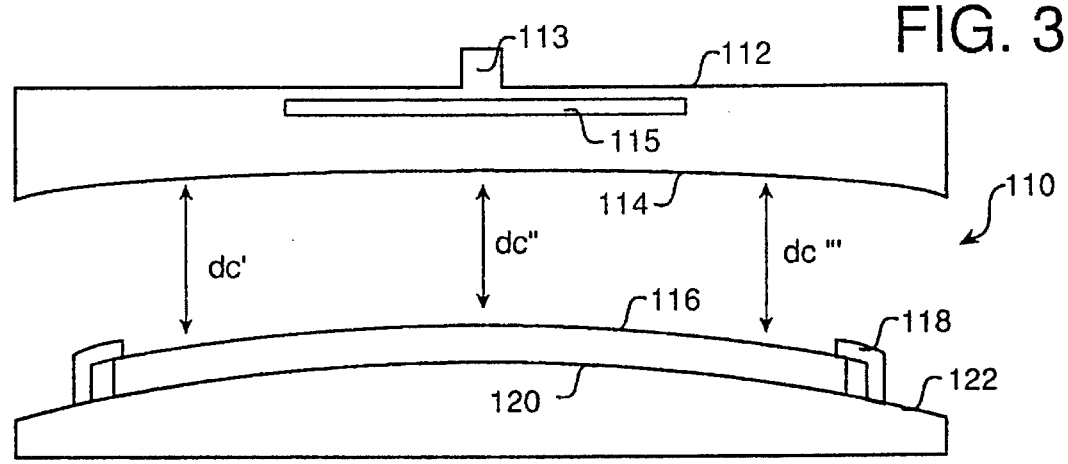
FIG. 3c is a pictorial view of a third embodiment of the present invention where the dispersion plate curvature is less than the curvature of the pedestal and wafer.

FIG. 3c is a pictorial view of a semiconductor wafer processing system 110 where a fluid dispersion head 112 has a fluid inlet 113 and a bottom surface 114 provided with a plurality of apertures, where the radius of curvature of the surface 114 is greater than the radius of curvature of the a wafer 116 held by a clamp 118 to a top surface 120 of a pedestal 122. The distances dc' and dc" are larger than dc" in this instance, i.e. dc'>dc"<dc'''. This is a preferred system for when the flow of fluid from the dispersion head 112 is greater flow at locations dc' and dc''', as when influenced by an internal baffle 115 provided in a fluid distribution head 72.

Figure 4A:
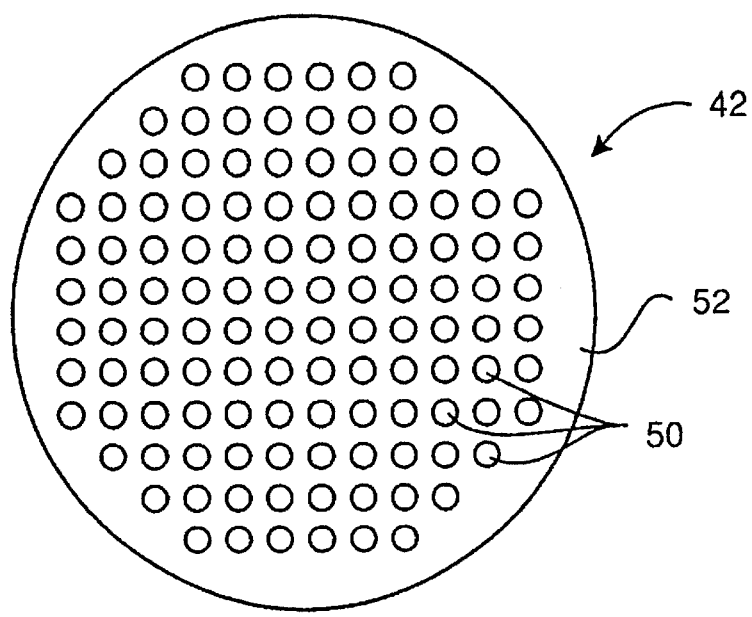
FIG. 4a is a view taken along line 4a—4a of FIG. 2.

FIG. 4a is view of a fluid dispersion head 42 taken along line 4a—4a of FIG. 2. Dispersion plate 52 is preferably circular in configuration and includes a plurality of fluid outlet apertures 50 distributed in a regular pattern. If the dispersion plate is to serve as an anode, it is made from a conductive material such as aluminum. If the dispersion plate not used as an anode, it may be made from a non-conductive material such as quartz.

Figure 4B:
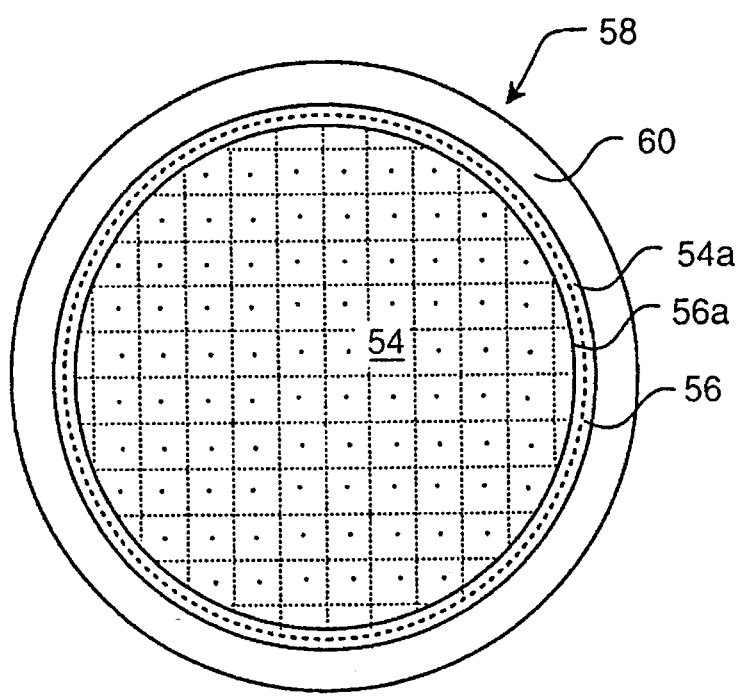
FIG. 4b is a view taken along line 4b—4b of FIG. 2.

FIG. 4b is view of a pedestal 58 taken along line 4b—4b of FIG. 2. The pedestal 58 (which preferably has a substantially circular surface) supports a semiconductor wafer 54 which is secured by a clamp 56 to a top surface 60 of the pedestal. In one embodiment, a ring clamp edge 56a fits just over a wafer edge 54a. In another embodiment, the clamp can include a number of fingers (e.g. 3 or 4 fingers) which engage portions of the circumference of the wafer 54. Preferably, the wafer 54 is located concentrically on the circular surface of the pedestal 58. In operation, the pedestal 58 serves as a cathode and thus is made from a conductive material such as aluminum.

An analysis of prior art CVD plasma processing systems indicates that a uniformity of 5% to 20% is typical when using a prior art CVD system. By manufacturing a fluid distribution head 42 with a non-planar dispersion in accordance with the present invention, a significantly improved uniformity of processing is achieved. Experimental results indicated that uniformities from about 1% to 3% can be achieved the method and apparatus of the present invention.

The dimensions of various portions of the present invention will depend upon the size of the wafer that the system is designed to accommodate. For example, to process six inch wafers, the pedestal is preferably about seven inches in diameter with a like-sized fluid distribution head. To accommodate eight inch wafers, a nine inch pedestal and fluid distribution head can be used.

While this invention has been described in terms of the preferred embodiment, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. A method for processing a semiconductor wafer comprising:

clamping a semiconductor wafer to a pedestal, thereby imposing a curvature on said semiconductor wafer; and releasing a process fluid over said semiconductor wafer through a plurality of apertures provided in a non-planar dispersion plate having a complementary curvature to the curvature of said semiconductor wafer.

2. A method for processing a semiconductor wafer as recited in claim 1 wherein said step of clamping a semiconductor wafer to a pedestal comprises engaging edge portions of said semiconductor wafer with a clamping mechanism coupled to said pedestal.

3. A method for processing a semiconductor wafer as recited in claim 1 wherein said step of releasing a process fluid comprises releasing a process gas over said semiconductor wafer.

4. A method for processing a semiconductor wafer as recited in claim 3 wherein said step of releasing a process gas comprises:

providing a chamber which communicates with said dispersion plate; and coupling said chamber to a source of process gas.

5. A method for processing a semiconductor wafer as recited in claim 4 further comprising the step of coupling an R.F. generator means to said pedestal to create a plasma between said pedestal and said dispersion plate front said process gas.

6. A method for processing a semiconductor wafer as recited in claim 5 further comprising the step of forming said dispersion plate with a concave, spherical surface having a radius of curvature of at least four feet.

7. A method for processing a semiconductor wafer as recited in claim 1 wherein said dispersion plate has a radius of curvature approximately the same a radius of curvature of said wafer.

8. A method for processing a semiconductor wafer as recited in claim 1 wherein said dispersion plate has a radius of curvature greater than a radius of curvature of said wafer.

9. A method for processing a semiconductor wafer as recited in claim 1 wherein said dispersion plate has a radius of curvature less than a radius of curvature of said wafer.

* * * * *